United States Patent [19]

Porrot

[11] Patent Number: 4,737,724
[45] Date of Patent: Apr. 12, 1988

[54] VARIABLE DIGITAL PHASE-SHIFTER AND DIGITAL VELOCITY CORRECTOR FOR USE IN VIDEO RECORDERS

[75] Inventor: Pascal Porrot, Monteson, France

[73] Assignee: Thomson Video Equipment, Gennevilliers, France

[21] Appl. No.: 864,861

[22] Filed: May 20, 1986

[30] Foreign Application Priority Data

May 24, 1985 [FR] France .................. 85 07902

[51] Int. Cl.⁴ .......................... H03K 5/13; H03K 5/22
[52] U.S. Cl. ................................. 328/155; 328/133; 328/167; 328/170; 307/262; 307/511; 307/350; 358/312; 364/178; 364/825
[58] Field of Search ................ 364/572, 178, 825; 328/167, 133, 168, 170, 155; 307/264, 350, 552, 262, 511; 358/312, 319

[56] References Cited
U.S. PATENT DOCUMENTS 3,566,285  2/1971  Schroeder .................. 307/264
3,997,973  12/1976  Buss ........................ 333/70 T

*Primary Examiner*—Stanley D. Miller
*Assistant Examiner*—Richard Roseen
*Attorney, Agent, or Firm*—Cushman, Darby & Cushman

[57] ABSTRACT

A variable digital phase-shifter comprises a variable-propagation-time phase corrector consisting of a non-recursive transversal digital filter having a predetermined even number N of coefficients. The filter is coupled with an amplitude corrector consisting of a non-recursive transversal digital bandpass filter with an odd number of coefficients, a multiplier and a summing circuit for correcting the variations in gain of the phase corrector in order to obtain an approximately constant overall gain of the variable digital phase-shifter.

4 Claims, 12 Drawing Sheets

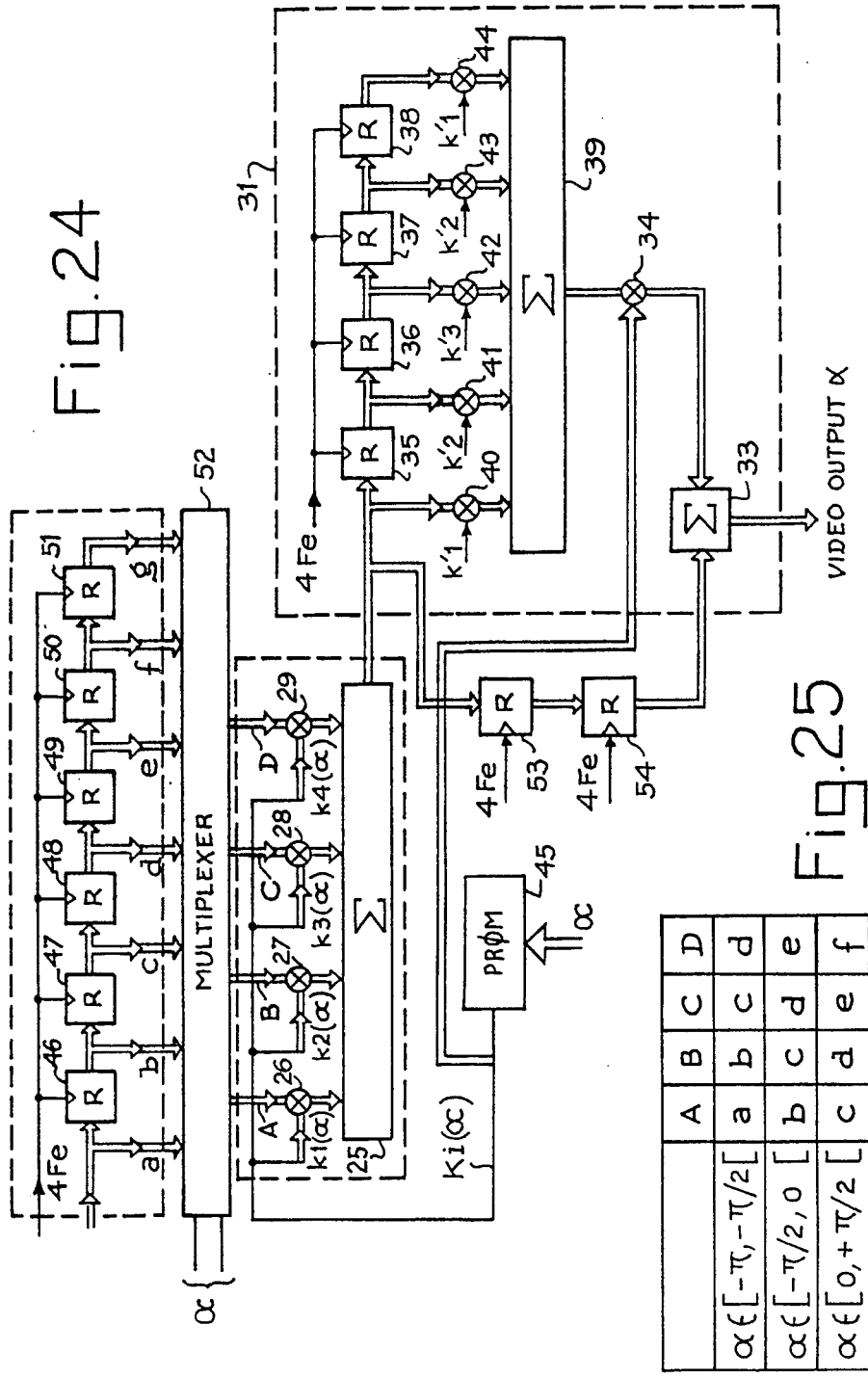

| INSTANTS | IMPULSE AMPLITUDE RESPONSE |
|---|---|
| t | 0 |
| t+Te | $[k_1(\alpha).k'_1]I(\alpha)=K_1(\alpha)$ |
| t+2Te | $[k_2(\alpha).k'_1+k_1(\alpha).k'_2].I(\alpha)=K_2(\alpha)$ |
| t+3Te | $[k_3(\alpha).k'_1+k_2(\alpha).k'_2+k_1(\alpha).k'_3].I(\alpha)+k_1(\alpha)=K_3(\alpha)$ |
| t+4Te | $[k_4(\alpha).k'_1+k_3(\alpha).k'_2+k_2(\alpha).k'_3+k_1(\alpha).k'_2].I(\alpha)+k_2(\alpha)=K_4(\alpha)$ |
| t+5Te | $[k_4(\alpha).k'_2+k_3(\alpha).k'_3+k_2(\alpha).k'_2+k_1(\alpha).k'_1].I(\alpha)+k_3(\alpha)=K_5(\alpha)$ |
| t+6Te | $[k_4(\alpha).k'_3+k_3(\alpha).k'_2+k_2(\alpha).k'_1].I(\alpha)+k_4(\alpha)=K_6(\alpha)$ |
| t+7Te | $[k_4(\alpha).k'_2+k_3(\alpha).k'_1].I(\alpha)=K_7(\alpha)$ |
| t+8Te | $[k_4(\alpha).k'_1].I(\alpha)=K_8(\alpha)$ |
| t+9Te | 0 |

Fig.26

VARIABLE DIGITAL PHASE-SHIFTER AND DIGITAL VELOCITY CORRECTOR FOR USE IN VIDEO RECORDERS

BACKGROUND OF THE INVENTION

1. Field of the Invention

The present invention relates to a variable digital phase-shifter and more particularly to a digital velocity corrector for a video recorder in which a phase-shifter of this type is employed.

2. Description of the Prior Art

In video recorders, a velocity corrector has the function of correcting the phase error produced between the temporal reference of the recorded video signal and the temporal reference of the corresponding video signal which has been delivered by the camera equipment. Velocity correctors of known types either call for the use of purely analog solutions in which phase lags are compensated by delay lines or else they make use of hybrid devices which operate in both digital and analog modes and in which provision is made for a sampling clock phase-modulated as a function of the phase error produced between the temporal references of the recorded video signal and the corresponding video signal which has been delivered by the camera equipment.

In either of the two alternatives just mentioned, the delay lines employed and the voltage-controlled oscillators which permit phase-modulation of the sampling signal entail the need for adjustments and result in a non-negligible increase in price of video recorders which incorporate velocity correctors of the type mentioned in the foregoing. Solutions to these drawbacks can undoubtedly be found by making use of entirely digital phase-correcting devices, but these solutions still carry a heavy cost penalty, mainly by reason of the large number of numerical operators required for their practical application.

SUMMARY OF THE INVENTION

The aim of the invention is to overcome the disadvantages outlined in the foregoing.

To this end, the invention is directed to a variable digital phase-shifter which essentially comprises a variable-propagation-time phase corrector constituted by a nonrecursive transversal digital filter having a predetermined even number N of coefficients and coupled to an amplitude correctors for correcting the variations in gain of the phase corrector in order to obtain an approximately constant overall gain of the variable digital phase-shifter.

The invention also has for its object a velocity corrector for a digital video recorder having the function of correcting the phase error existing between the temporal reference of a recorded video signal and the temporal reference of the video signal delivered by the camera equipment, the variable digital phase-shifter mentioned in the foregoing being essentially incorporated in the corrector.

BRIEF DESCRIPTION OF THE DRAWINGS

Other features of the invention will be more apparent upon consideration of the following description and accompanying drawings, wherein:

FIG. 24 illustrates the structural arrangement of the velocity corrector in accordance with the invention;

FIG. 25 is a state diagram which serves to explain the method adopted for switching of the video signals at the input of the phase corrector;

FIG. 26 is a table representing the impulse response of the velocity-corrector filter which corresponds to an eight-coefficient filter.

DETAILED DESCRIPTION OF THE INVENTION

The variable digital phase-shifter as applied to the velocity corrector in accordance with the invention has the function of correcting the errors which arise during scanning of a predetermined image line by the video-signal synchronization signals. This correction guarantees rephasing of the chrominance signals carried by the video signal but does not guarantee phasing of the video signal recorded on the line phase of the equipment used for recording. In other words, the recorded video signal which varies elastically in time is converted by the velocity corrector to a stable signal within the line retrace time interval of the video signal.

The principle of correction adopted will hereinafter be described with reference to the time-waveform diagram of FIG. 1. For the sake of enhanced clarity, consideration will be given to a sine-wave signal V'(t) restored by the read heads of a video recorder with respect to the corresponding signal V(t) which has been delivered by the camera equipment.

Figure 1:
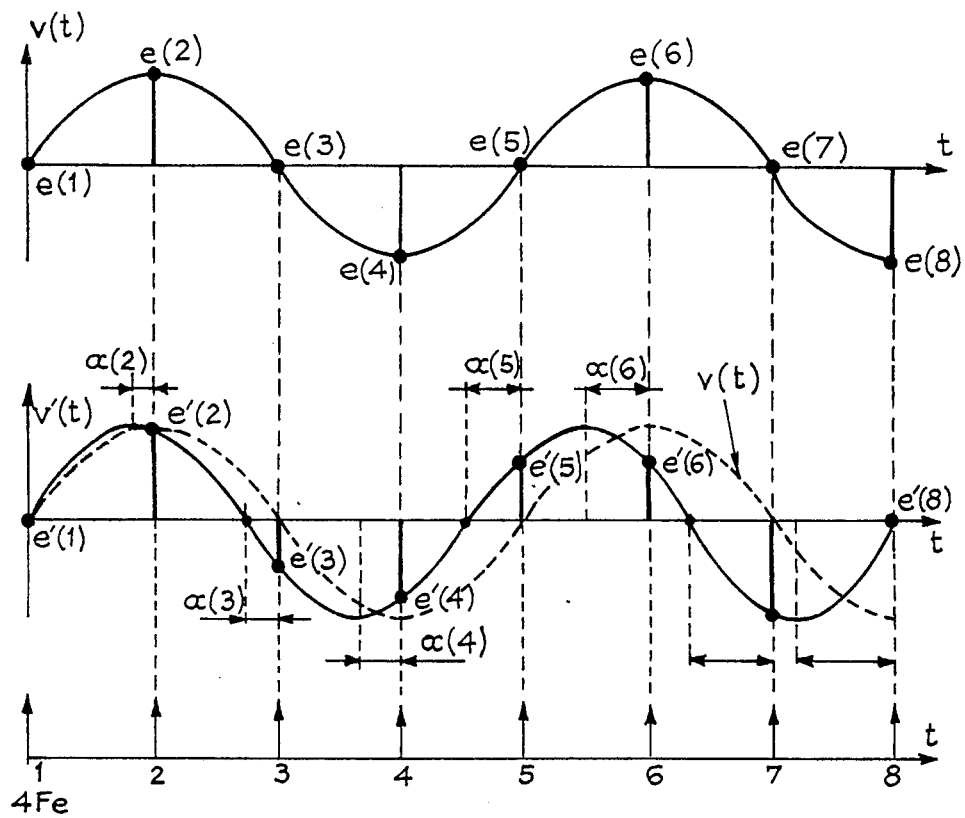
FIG. 1 is a time-waveform diagram illustrating the principle involved in phase error correction and employed in the velocity corrector in accordance with the invention.
Figure 2:
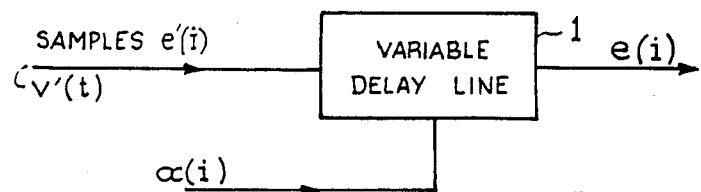
FIG. 2 is a diagram illustrating the principle employed in the constructional design of a velocity corrector in accordance with the invention.

FIG. 1 also shows samples of these signals e(i) and e'(i) spaced at intervals of (1/4Fe), where Fe designates the frequency of the color subcarrier phase reference signal delivered by the camera equipment. Compared with the signal V(t), the signal V'(t) which appears is vitiated by a timebase error. The samples e(i) and e'(i) which have a constant spatial distribution by reason of the sampling frequency 4Fe represent the signals V(t) and V'(t) with an instantaneous timebase error $\alpha(i)$. In order to correct the signal V'(t), the samples e'(i) have to be computed from samples e(i) and from the phase error $\alpha(i)$ at the instants t(i). In accordance with the invention, this computing operation is performed by means of an "all-pass" filter of special design as represented schematically by the reference numeral 1 in FIG. 2. This filter receives the sampled signal V'(t) and the instantaneous phase reference $\alpha(i)$. The filter delivers the sequence of samples e(i) of the corrected signal corresponding to V(t). Since the spatial distribution of the samples is constant, the "all-pass" digital filter makes it possible to change the phase of the samples by modifying their amplitudes.

However, in the application under consideration, the "all-pass" filter must have a constant propagation time $\tau(i)$ with respect to a given phase reference $\alpha(i)$. This condition is necessary in order to obtain a linear phase $\phi(i) = \omega \cdot \tau(i)$ throughout the range of video frequencies comprised, for example, of between 0 and 5.5 MHz since a non-linear phase would produce a differential phase distortion which would have a detrimental effect on color fidelity. Under these conditions, the "all-pass" filter is therefore equivalent to a variable delay line.

The instantaneous phase reference $\alpha(i)$ corresponding to the fine phase error which is the error in velocity of the video signal read on the video recorder tape is computed over a range of one color subcarrier period of the television standards designated as the PAL or NTSC systems in which the phase is representative of the color. In the television standard known as the SECAM system, the relative equivalent is measured on the horizontal synchronizing pulse. Under these conditions, the phase error can be expressed over an angular range of $2\pi$ radians and the total errors of $n \cdot (\pi/2)$ radians are corrected by producing a translation of the sampled video signal corresponding to n times the sampling period and by choosing a value of this period which is four times the value of the color subcarrier frequency. This makes it possible, after correction of the signal corresponding to the whole number of clock-pulse sampling steps included in the measurement $\alpha(i)$, to correct the error within one sampling step $(0, \pi/2)$. In 625-line standards, the step just mentioned has a time-duration of 56 ns whereas, in 525-line standards, the step has a time-duration of 70 ns. By way of example, measurement of the fine phase error can be expressed in digital code and represented by a word having a length of 9 bits corresponding to 512 levels in respect of a range of $2\pi$ radians or else 128 steps in respect of a range of $\pi/2$ radians. The elementary step will in that case be 90° divided by 128 or 0.7°, or else 0.44 ns in the PAL standard. It will naturally be understood that, whatever type of construction may be adopted, the velocity corrector must have a negligible inherent error with respect to the fine error measurement in order to maintain accuracy of measurement.

Figure 3:
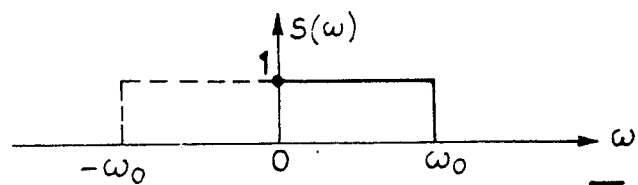
FIG. 3 shows the amplitude/frequency response of an ideal low-pass filter.
Figure 4:
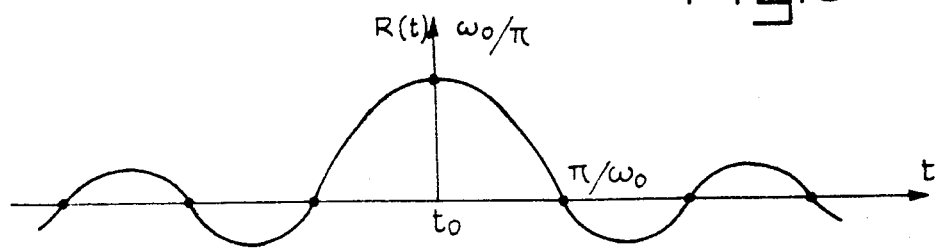
FIG. 4 shows the impulse response of an ideal low-pass filter.

The low-pass filter in accordance with the invention has an impulse response which comes as close as possible to the impulse response of a low-pass ideal filter characterized by a rectangular amplitude/frequency response $S(\omega)$ with a cutoff frequency $f_o = (\omega_o/2\pi)$ as shown diagrammatically in FIG. 3 (where $f_o$ is equal to one-half times the sampling frequency or twice the reference frequency) and by a time response R(t) shown in FIG. 4 which satisfies the relation:

$$R(t) = \frac{\omega_o}{\pi} \cdot \frac{\sin \omega_o t}{\omega_o t} . \quad (1)$$

The corresponding graph shown in FIG. 4 results from computation of the inverse Fourier transform of the response $S(\omega)$ defined by the relation:

$$R(t) = \frac{1}{2\pi} \int_{-\omega_o}^{+\omega_o} S(\omega) \cdot e^{j\omega t} \cdot d\omega \quad (2)$$

Figure 5:
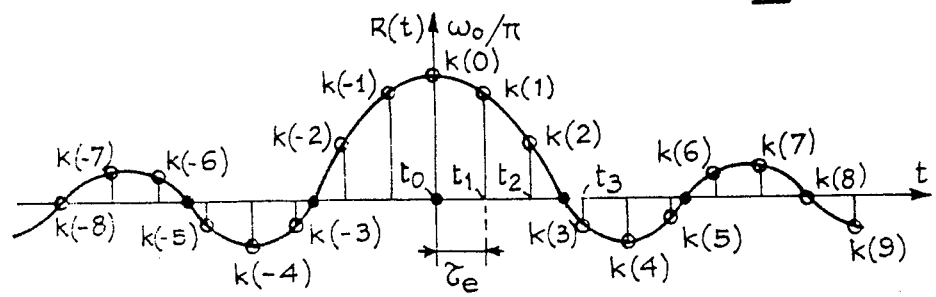
FIG. 5 shows the mode of sampling of the impulse response of an ideal low-pass filter in order to obtain a linear-phase low-pass digital filter.

The impulse response of the equivalent digital filter is shown in the diagram of FIG. 5.

Figure 6:
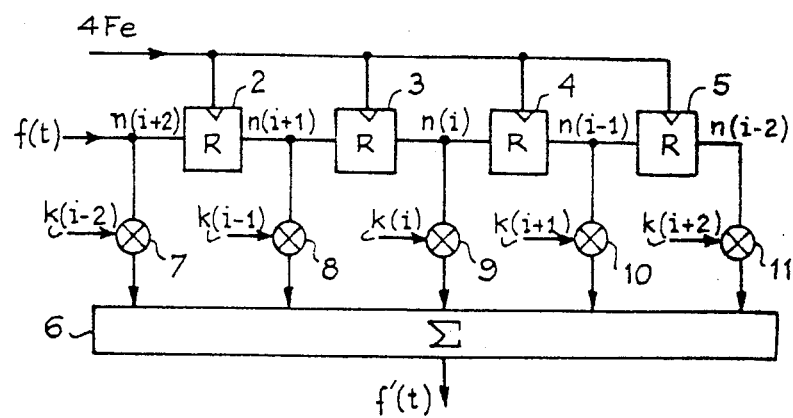
FIG. 6 illustrates a constructional arrangement of a linear-phase low-pass digital filter.

One constructional arrangement of a filter of this type is illustrated in FIG. 6. The filter of FIG. 6 has the structure of a nonrecursive transversal filter and is formed by the array of registers 2 to 5 which are connected in series and operate at a frequency 4Fe. The respective outputs of the registers 2 to 5 are connected to a summing circuit 6 through multiplier circuits numbered respectively from 7 to 11.

Time division of the signal to be filtered into instants t(i) is obtained under these conditions by means of the series-connected registers 2 to 5 which transmit the samples n(i) at the rate of the sampling frequency 4Fe defined earlier. The digital filter which has the characteristics mentioned in the foregoing is obtained by forming in the summing circuit 6 the sum of samples n(i) taken at the instants t(i) multiplied by the coefficients k(i) applied to the inputs of the multiplier circuits 7 to 11. The amplitudes of the samples of the sampled response at the frequency 4Fe represented in FIG. 5 gives the multiplication factors or coefficients k(i) of the filtered signal taken at the instants t(i).

The foregoing considerations naturally suppose that the conditions of the Shannon theorem are satisfied and that the number of coefficients k(i) is not limited. In fact, the impulse response of the filter shown in FIG. 5 is truncated since the number of coefficients employed is finite and its spectral response S(ω) does not exactly correspond to the spectral response of the ideal low-pass filter defined earlier.

Furthermore, since the interval between two video samples n(i), n(i+1) is constant and equal to the sampling period τ(e)=(1/4Fe), the phase of the sample of order n(i+1) with respect to the phase of the sample of order n(i) is equal to φn(i+1)=ω. τe.

In a more general sense, an odd-order filter, or in other words a filter having an odd number of coefficients N, will have a constant time-delay which is equal to (N−1/2). τe and corresponds to a whole number of sampling periods τe, and an even-order filter will have an equally constant time-delay equal to (N−1/2). τe equal to a whole number of half-periods τe. By permitting a choice of the order, it is consequently possible to produce a phase shift between p·τe and p·τe±(τe/2), where p is an integer.

In cases, for example, in which the filters employed are of order N=5 and of order N=4 and in the field in which the amplitude/frequency response T(ω) is equal to 1, the digital video signal f'(t) obtained at the output of the corresponding filters as a function of the digital video signal f(t) applied to the input of the filter is represented by the following expressions:

in the case of N=5→f'(t)=f(t−2τe)
in the case of N=4→f'(t)=f(t−1·5τe).

Determination of the modulus of nonrecursive filters in accordance with the invention by means of a vectorial representation is as follows: the origin of the phases is determined by the point corresponding to the time-delay of the filter (N−1/2)·τe, whence $$\phi o = -\omega \cdot \left(\frac{N-1}{2}\right) \cdot \tau e.$$

Figure 7:
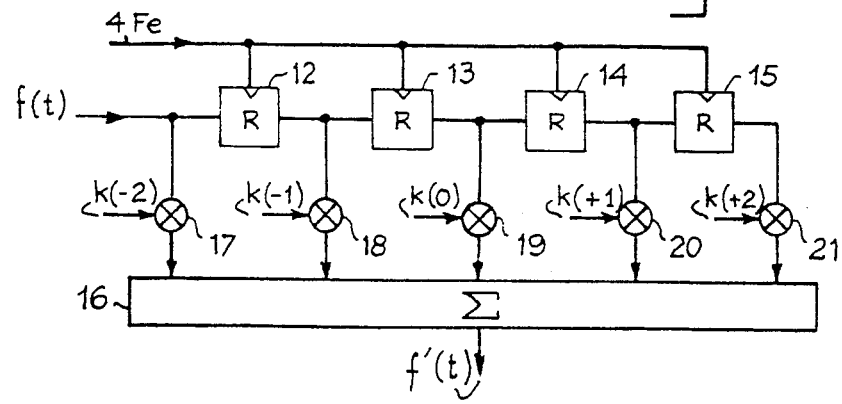
FIG. 7 illustrates a constructional example of an odd-order digital filter.
Figure 8:
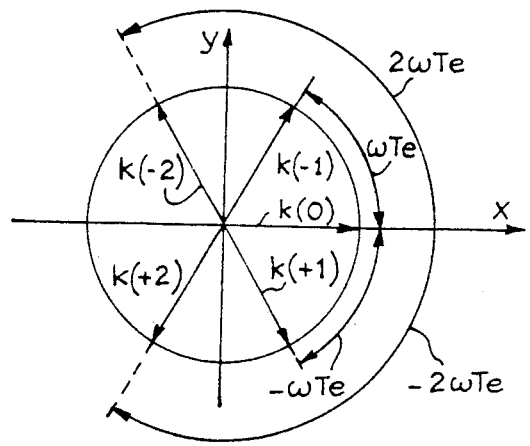
FIG. 8 is a vectorial representation of a method for determining the modulus of the transfer function of the filter shown in FIG. 7.

The corresponding vectorial representation in the case of a nonrecursive transversal filter of order N=5 and of the type represented by the elements 12 to 21 of FIG. 7 is described hereinafter with reference to FIG. 8.

In accordance with this representation, the sum of projections on the Y-axis of the figure is zero. The phase is consequently equal to 0 or to π with respect to the origin of phases φo. In this case, the modulus of the transfer function T(ω) of the filter is given by the absolute value of the sum of projections on the X-axis. The symmetry of the impulse response produces a symmetry between the vectors k(i) and k(−i) with respect to the X-axis.

In the case of an odd-order filter with N coefficients, the modulus M(ω) will be given by the relation:

$$M(\omega) = ko + 2k(1) \times \cos(\omega\tau e) + 2k(2) \times \cos(2\omega\tau e) + \ldots + \quad (4)$$

$$2k(N-1) \times \cos\left(\frac{N-1}{2}\right)\omega\tau e.$$

Figure 9:
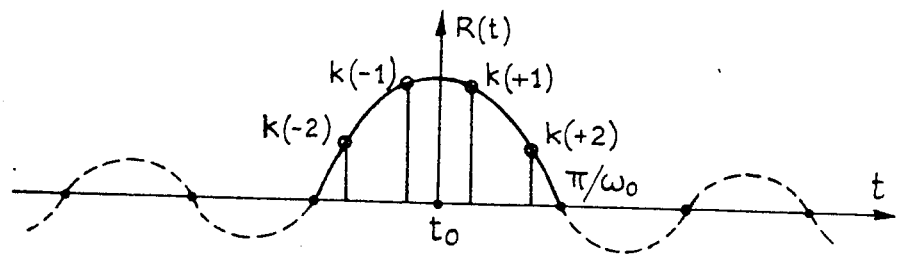
FIG. 9 shows the distribution of coefficients k(i) of an even-order filter.
Figure 10:
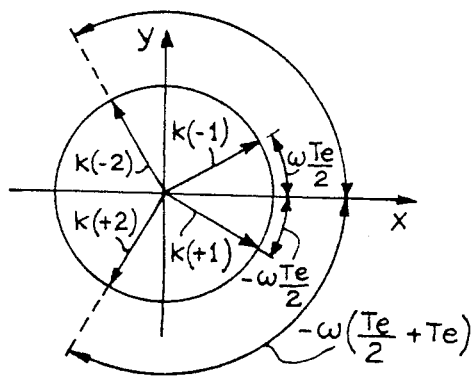
FIG. 10 is a vectorial representation of a method for determining the transfer function of an even-order filter.

In the case of a filter having an even order such as N=4, for example, the origin of phases is determined by $$\phi o = -\omega \frac{N-1}{2} \tau e$$

whence $$\phi o = -\omega \cdot 1.5\tau e,$$

and the coefficients k(i) are distributed as shown in FIG. 9, that is to say, symmetrically with respect to the origin to of the impulse response R(t). There is no central coefficient k(o). The modulus M(ω) is given by the absolute value of the sum of the vectors k(i) projected on the X-axis in accordance with the vectorial representation of FIG. 10. Again in accordance with this representation, the sum of projections on the Y-axis of FIG. 10 is zero. The phase of the resultant vector is zero or is equal to π with respect to the phase origin $$\phi o = -\omega \cdot \frac{N-1}{2} \cdot \tau e.$$

In the case of an even-order filter, the modulus M(ω) is given by the general relation $$M(\omega) = 2k(1) \times \cos(0.5\, \omega\tau e) + 2k(2) \times \cos(1.5\, \omega\tau e) + \ldots + \quad (5)$$

$$2k(N/2) \times \cos\left(\frac{N-1}{2}\right)\omega\tau e).$$

The structure of a variable-propagation-time filter in accordance with the invention is obtained from the ideal impulse response of a low-pass filter with one pulse δ(t). The structural design of this filter is shown diagrammatically in FIG. 11.

Figure 11:
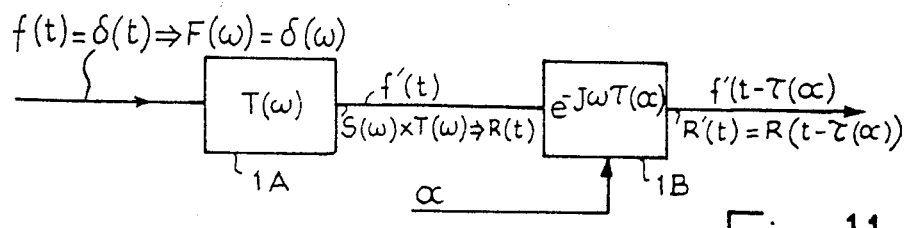
FIG. 11 is an equivalent diagram of a variable-propagation-time filter.
Figure 12:
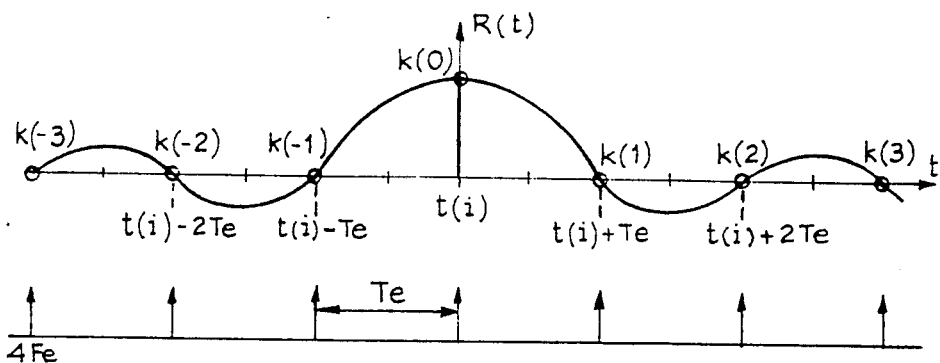
FIG. 12 shows the impulse response of an odd-order ideal low-pass filter.
Figure 13:
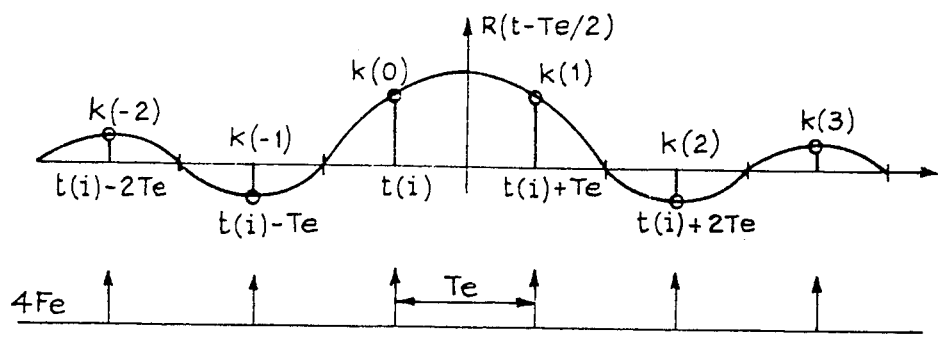
FIG. 13 shows the impulse response of a sampled ideal low-pass filter with a time-delay of one sampling half-period.

The impulse response R'(t) at the output of the filter shown in FIG. 11 is equal to the impulse response R(t) delayed by τ(α), with τ(α)=α/ωe, where ωe is the pulsation or angular frequency of the phase reference of the color burst signals. This principle is valid insofar as the modulus M(ω) of the transfer function T(ω) of the low-pass filter is equal to 1 in the useful passband. An ideal low-pass filter of odd order in which the cuttoff frequency fo corresponds to the sampling half-frequency 2Fe gives the sampled impulse response of FIG. 12 in which it is apparent that all the coefficients k(i) where i is different from 0 are zero. The coefficient k(o) is alone equal to 1 and the time-delay of the filter is constant and equal to t(i). In the same filter which has a constant time-delay t(i)+Te with Te=(π/2ωe), all of these coefficients are zero except for the coefficient k1 which assumes the value 1 in this case. The same filter is also obtained with a constant time-delay ti=(Te/2) by producing the impulse response R(t) by means of the coefficients k(i) of FIG. 13.

Generally speaking, a low-pass filter having any predetermined time-delay τ(α) with respect to the reference time-delay t(i) is obtained by translating the impulse response R(t) by τ(α) and by sampling this latter in order to obtain the value of the coefficients k(i). This method is employed for constructing the velocity corrector which has the design function of correcting the fine timebase error of the video signal.

In practice, the number of coefficients k(i) is limited and there consequently results a variation in the amplitude/frequency response as a function of the required time-delay τ(α). This variation in amplitude results in noise which is particularly objectionable in the low-frequency spectrum and in the chrominance spectrum around the color subcarrier. The coefficients k(i) are consequently computed so as to ensure that these two points of the frequency spectrum do not vary in amplitude and in phase.

Figure 14A:
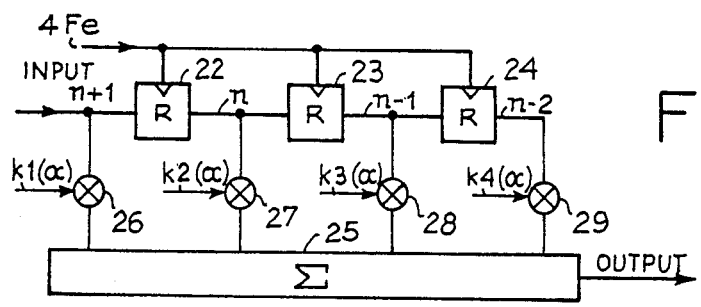
FIGS. 14A, 14B, 14C and 14D show the impulse responses and the variation in modulus $M(\omega)$ of a phase corrector having four coefficients.
Figure 14B:
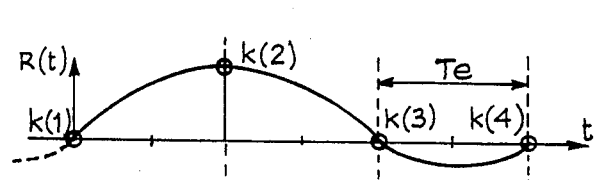
Figure 14C:
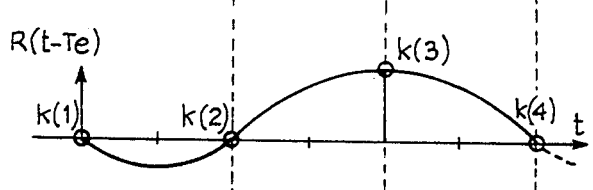
Figure 14D:
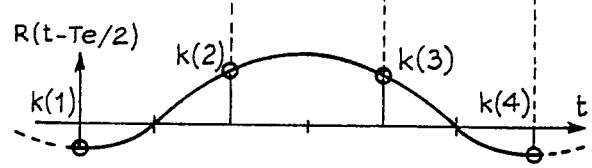
Figure 14D:
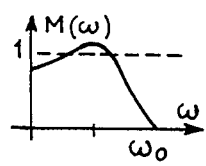

A realization in accordance with this principle is described hereinafter with reference to FIGS. 14A to 14D. FIG. 14A represents the structure of the phase corrector in the form of a nonrecursive transversal filter with four coefficients k1($\alpha$) to k4($\alpha$) formed of three registers 22, 23 and 24, a summing circuit 25 and four multipliers 26 to 29. FIGS. 14B to 14D show the impulse responses and the variations in modulus M($\omega$) of the filter transfer function in respect of phase shifts $\alpha$ having the respective values 0, ($\pi/2$) and ($\pi/4$). Under these conditions, the filter time-delay $\tau(\alpha)=(\alpha/\omega e)$ varies from 0 to Te when $\alpha$ varies from 0 to ($\pi/2$). The whole-number steps of n times ($\pi/2$) of the phase error are corrected by translation of nTe of the base time-delay scale constituted by the registers 22 to 24. By maintaining an impulse response R(t) of the form (sin $2\alpha/2\alpha$), the modulus is not constant and passes through a maximum variation in respect of $\alpha=(\pi/4)$ as shown in FIG. 14D, namely in respect of $\tau=$(Te/2), the origin of the phases being established by the coefficient k2.

Determination of the coefficients k(i)($\alpha$) is carried out so as to ensure that, at the output of the corrector, two points of the frequency spectrum have a constant modulus M($\omega,\alpha$) equal to 1 and a phase $\phi(\omega,\alpha)$ equal to $-\omega\tau(\alpha)=(\alpha/\omega e)$ irrespective of the time-delay reference $\tau(\alpha)=(\alpha/\omega e)$. These two points are $\omega=0$ and $\omega=\omega e=(\pi/2Te)$. These conditions are necessary in order to prevent low-frequency line-structure noise and color phase and amplitude noise in the chrominance spectrum.

Figure 15:
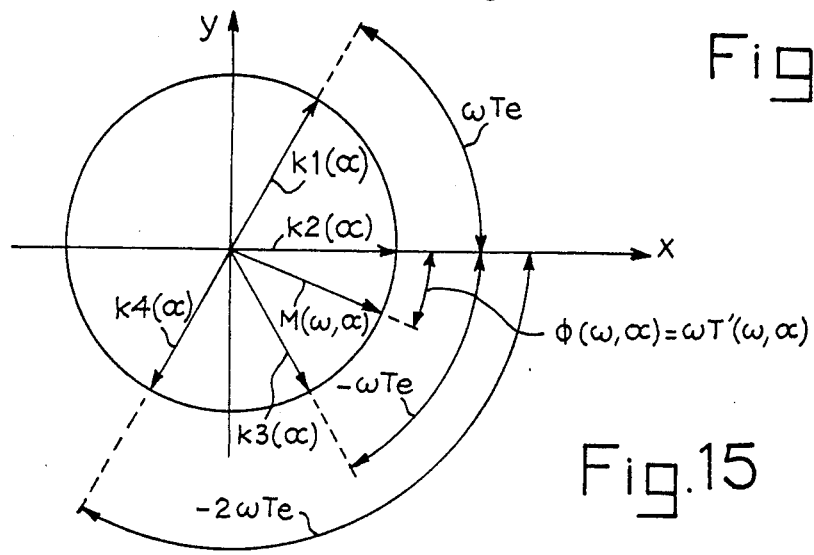
FIGS. 15 and 16 are vectorial representations of the modulus $M(\omega)$ and of the phase $\phi(\omega,\alpha)$ obtained as a function of the coefficients k(i) applied to the four-coefficient filter shown in FIG. 14A.
Figure 16:
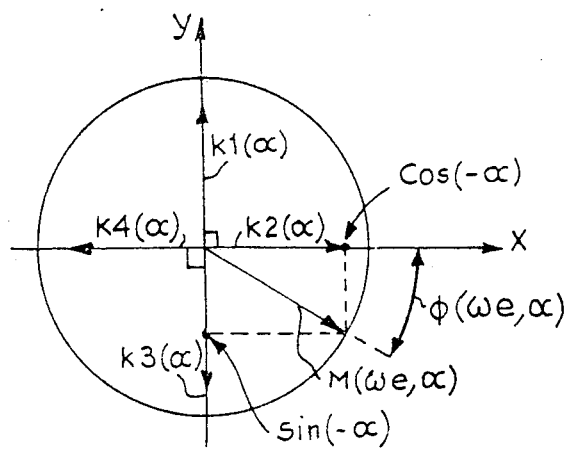

The corresponding vectorial representations of FIGS. 15 and 16 serve to determine the modulus M($\omega,\alpha$) and the phase $\phi(\omega,\alpha)$ from the coefficients k(i).

In FIG. 15, the sum of projections of the vectors k(i)($\alpha$) on the X-axis yields X($\omega,\alpha$) in accordance with the relation:

$$X(\omega,\alpha) = k1(\alpha)\cos(\omega Te) + k2(\alpha) + k3(\alpha)\cos(-\omega Te) + k4(\alpha)\cos(-2\omega Te). \quad (6)$$

The sum of projections of the vectors k(i)($\alpha$) on the Y-axis, on the other hand, yields $\phi(\omega,\alpha)$ in accordance with the relation:

$$\phi(\omega,\alpha) = k_1(\alpha)\sin(\omega Te) + k3(\alpha)\sin(-\omega Te) + k4(\alpha)\sin(-2\omega Te). \quad (7)$$

The modulus M($\omega,\alpha$) and the phase $\phi(\omega,\alpha)$ can be deduced from the formulae (6) and (7) by the relations:

$$M(\omega,\alpha) = \sqrt{X^2(\omega,\alpha) + Y^2(\omega,\alpha)} \quad (8)$$

and $$\phi(\omega,\alpha) = \text{Arc } tg(Y(\omega,\alpha)/X(\omega,\alpha)). \quad (9)$$

The time-delay $\tau'(\omega,\alpha)$ is also deduced therefrom by the relation:

$$\tau'(\omega,\alpha) = -\frac{1}{\omega}\phi(\omega,\alpha) \quad (10)$$

which is to be compared with the desired theoretical time-delay $\tau(\alpha)=(\alpha/\omega e)$.

At the point $\omega=\omega e$, the vectorial representation is that of FIG. 16. On the basis of FIG. 16, the following relations may be written:

$$k2(\alpha)-k4(\alpha)=\cos(-\alpha) \quad (11)$$

$$k1(\alpha)-k3(\alpha)=\sin(-\alpha). \quad (12)$$

Equations (11) and (12) also verify the condition imposed on the modulus M($\omega e,\alpha$), so that $$M(\omega e,\alpha) = \sqrt{\cos^2\alpha + \sin^2\alpha} = 1. \quad (13)$$

In respect of $\omega=0$, a third equation is obtained as a result of the condition that the modulus M(0,$\alpha$) must be equal to 1, that is, $$k1(\alpha)+k2(\alpha)+k3(\alpha)+k4(\alpha)=1. \quad (14)$$

Since the phase in the case of $\omega=0$ is not significant, it is possible to write in accordance with this condition that the limit of X($\omega\to 0,\alpha$) tends towards 1 when $\omega$ tends towards 0 since the cosines tend towards 1 and the limit of Y($\omega\to 0,\alpha$) is equal to $\omega Te\cdot[(K1(\alpha)-K3(\alpha)-2k4(\alpha))]$ since Sin $\omega Te$ tends towards $\omega Te$ when $\omega$ tends towards 0. A knowledge of X($\omega\to 0,\alpha$) and Y($\omega\to 0,\alpha$) makes it possible to determine the phase of $\phi(\omega\to 0,\alpha)$ by the relations:

$$\phi(\omega\to 0,\alpha)=\text{arc } tg(Y(\omega\to 0,\alpha))$$

with $Y(\omega\to 0,\alpha)\to 0$ whence $$\phi(\omega\to 0,\alpha)=Y(\omega\to 0,\alpha).$$

The time-delay of the filter then becomes $$\tau'(\omega\to 0,\alpha) = -\frac{1}{\omega}Y(\omega\to 0,\alpha) = Te(-K1(\alpha) + K3(\alpha) + 2K4(\alpha)).$$

This time-delay $\tau'(\omega\to 0,\alpha)$ must be equal to the desired time-delay, that is, $\tau(\alpha)=(\alpha/\omega e)$, whence $$Te(-k1(\alpha) + k3(\alpha) + 2k4(\alpha)) = \frac{\alpha}{\omega e} =$$

$$\frac{\alpha}{2\pi \times \frac{1}{4}Te} = \frac{2\alpha Te}{\pi},$$

The relation just given yields a fourth equation which is equal to $$-k1(\alpha) + k3(\alpha + 2k4(\alpha) = \frac{2}{\pi}. \quad (15)$$

The equations (11), (12) (14) and (15) form a system of four equations with four unknown factors k(i), which permits calculation of the coefficients k(i).

By solving this system of equations, we may write:

$$k1(\alpha) = \frac{1}{2}\left(1 - \frac{2\alpha}{\pi} - \cos \alpha\right) \tag{16}$$

$$k2(\alpha) = \cos \alpha + \frac{1}{2}\left(\frac{2\alpha}{\pi} - \sin \alpha\right) \tag{17}$$

$$k3(\alpha) = \frac{1}{2}\left(1 - \frac{2\alpha}{\pi} - \cos \alpha + 2 \sin \alpha\right) \tag{18}$$

$$k4(\alpha) = \frac{1}{2}\left(\frac{2\alpha}{\pi} - \sin \alpha\right) \tag{19}$$

with $\alpha$ varying from 0 to $(\pi/2)$ in respect of a time-delay located between 0 and Te.

Figure 17:
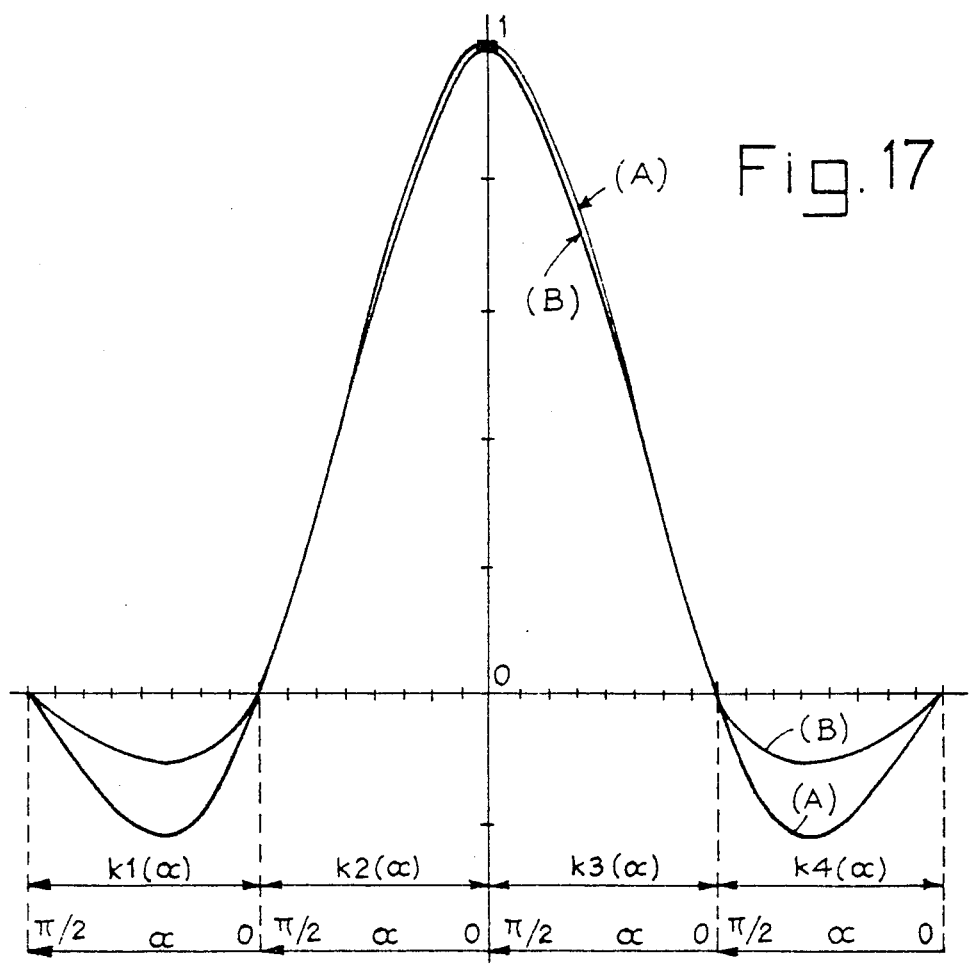
FIG. 17 shows the impulse response of the filter of FIG. 14A.

FIG. 17 represents the impulse response (B) of the filter obtained by means of the coefficients $k(i)(\alpha)$. This impulse response is compared with a theoretical impulse response (A) of the model filter shown in FIG. 3 and having an impulse response equal to (sin $2\alpha/2\alpha$).

Figure 18:
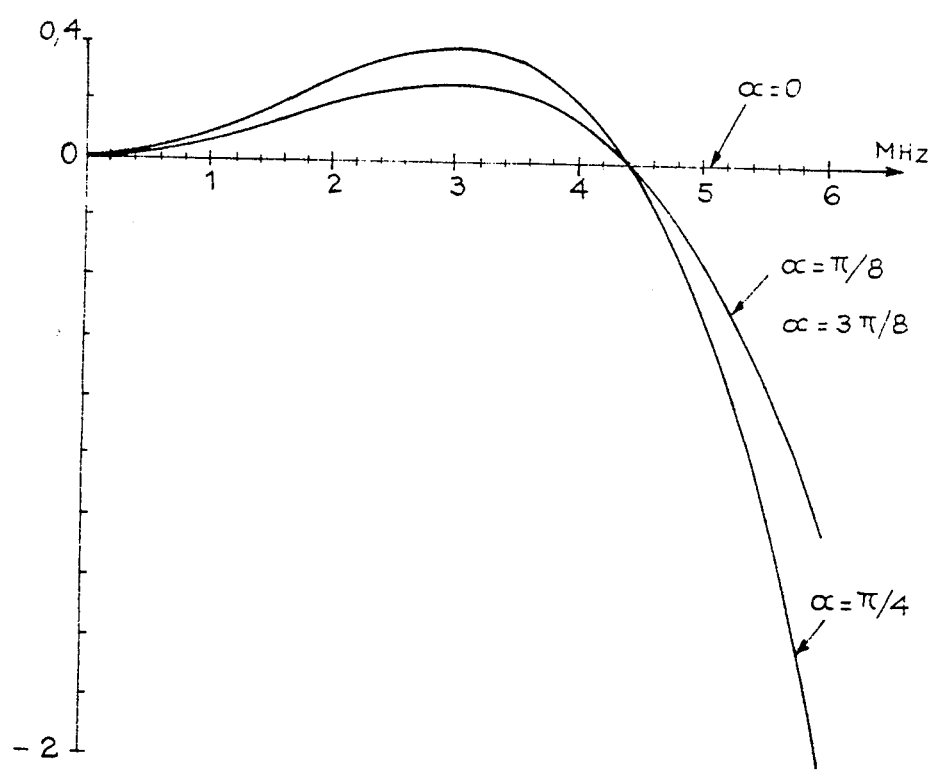
FIG. 18 shows the curve of amplitude of the modulus $M(\omega)$ of the transfer function of the filter of FIG. 14A as a function of the frequency.
Figure 19:
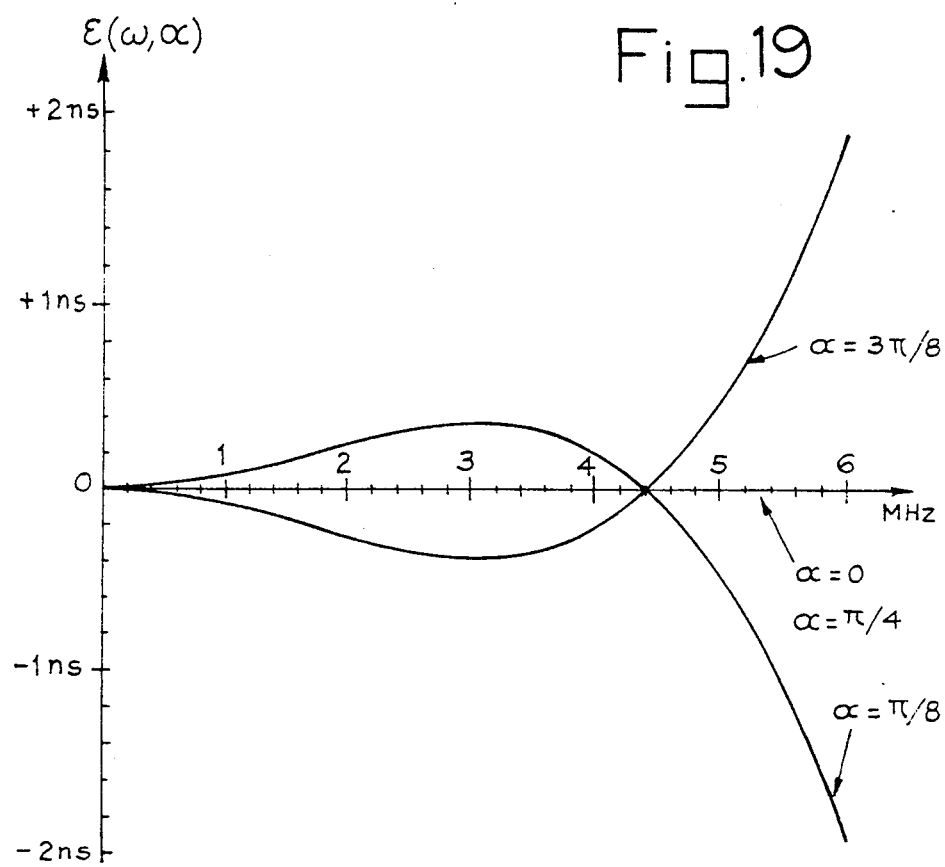
FIG. 19 is a graphical representation of the error in propagation time of the filter with respect to the desired phase reference.

Sampling of this impulse response at the values $\alpha$ yields the coefficients $k(i)(\alpha)$ of the phase corrector. A knowledge of the coefficients $k(i)(\alpha)$ makes it possible to compute the modulus $M(\omega,\alpha)$ shown in FIG. 18 and the phase $\phi(\omega,\alpha)$. From this phase $\phi(\omega,\alpha)$, there is deduced the propagation time error with respect to the reference $\tau(\alpha)=(\alpha/\omega e)$ (FIG. 19).

The propagation time error verifies the relations:

$$\epsilon(\omega,\alpha) = \tau'(\omega,\alpha) - \tau(\omega e,\alpha) \tag{20}$$

or again $$\epsilon(\omega,\alpha) = -\frac{1}{\omega} \times \psi(\omega,\alpha) - \frac{\alpha}{\omega e}. \tag{21}$$

Figure 20:
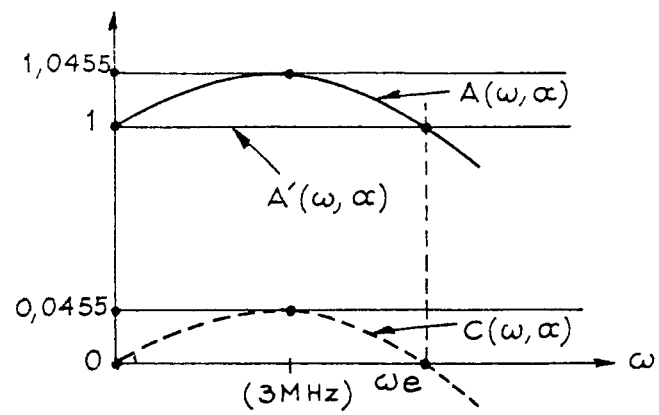
FIG. 20 illustrates the principle of amplitude correction adopted for correcting the variations in gain of the velocity corrector.

In the example of FIG. 19, the useful passband is within the range of 0 to 5.5 MHz, and the error in propagation time $\epsilon(\omega,\alpha)$ is totally negligible and smaller than 0.4 ns. In the case of frequencies located in the vicinity of 3.5 MHz, the modulus $M(\omega,\alpha)$ in FIG. 18 has a variation of 0 to 0.4 db as a function of $\alpha$, namely a gain which varies from 1 to 1.0455. The curve of variation is of the form $A \times \sin (2\alpha)$ with $A=1.0455$, the maximum value being defined in respect of $\alpha=\pi/4$). This variation in gain results in non-negligible amplitude noise of approximately 4.5%. A knowledge of the modulus $M(\omega,\alpha)$ serves to deduce (FIG. 20) the variation in gain $\Delta A(\alpha) = 1.0455 \times \sin (2\alpha)$ of the phase corrector in respect of F which differs from 3 MHz only to a slight extent.

Figure 21:
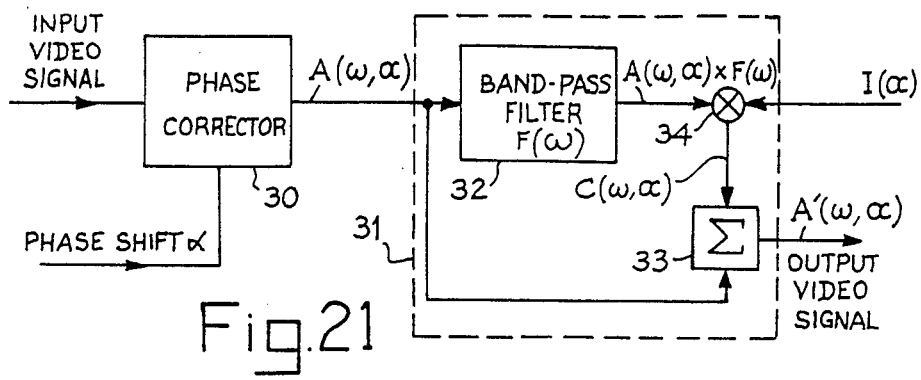
FIG. 21 is a block diagram illustrating the constructional arrangement of the velocity corrector in accordance with the invention.

The example of construction shown in FIG. 21 makes it possible to minimize the variation in gain at the output of the phase corrector. The device illustrated comprises the four-coefficient phase corrector 30 of the type which has just been described and a gain corrector 31 constituted by a bandpass filter 32, a summing circuit 33 and a multiplier circuit 34. The design function of the device is to subtract a value $C(\omega,\alpha)$ from the gain $A(\omega,\alpha)$ at the output of the velocity corrector in order to obtain a gain $A'(\omega,\alpha)$ after amplitude correction which is nearly unitary irrespective of the value of $\omega$ and $\alpha$ while maintaining the phase of the velocity corrector at a practically constant time-delay value.

The linear-phase (constant time-delay) bandpass filter 32 produces a variation in gain $F(\omega)$. The filter 32 is determined so as to have a zero gain in respect of $\omega=0$ and $\omega=\omega e$ and to pass through a maximum value at about 3 MHz. It is clearly apparent that $F(\omega)$ must be multiplied by a constant of proportionality $I(\alpha)$ which is a function of $\alpha$. Under these conditions, the value $C(\omega,\alpha)$ satisfies the equation:

$$C(\omega,\alpha) = A(\omega,\alpha) \times F(\omega) \times I(\alpha). \tag{22}$$

Figure 22:
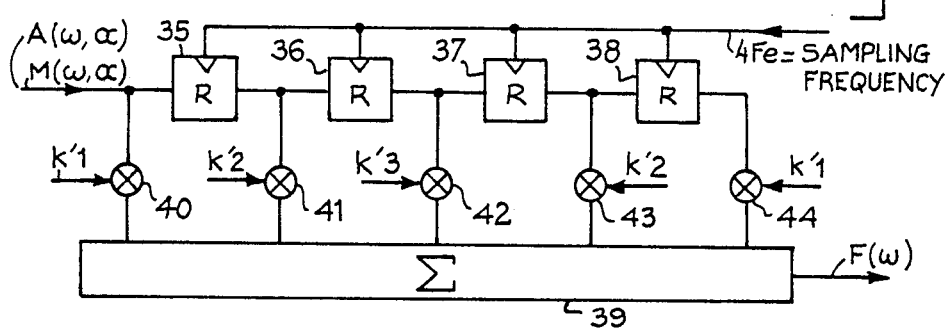
FIG. 22 illustrates a digital bandpass filter having five coefficients.

One constructional design of the bandpass filter 32 is shown in FIG. 22 and consists of a conventional non-recursive transversal filter having five coefficients which are symmetrical with respect to the central coefficient. As illustrated in the figure, the filter comprises four registers 35 to 38 connected in series and coupled with a summing circuit 39 through five multipliers 40 to 44. By endowing the filter of FIG. 22 with a constant time-delay equal to two sampling periods, the following relations are obtained:

$$2k'1 \times \cos (2\omega Te) + 2k'2 \times \cos (\omega Te) + k'3 = F(\omega) \tag{23}$$

and when $$\omega = 0, F(\omega) = 0 = 2k'1 + 2k'2 + k'3 \tag{24}$$

and when $$\omega = \omega e, F(\omega) = 0 = -2k'1 + k'3. \tag{25}$$

By choosing $k'3 = -1$ in order to obtain the same phase as at the midpoint of the filter, we obtain $$k'1 = -0.5, k'2 = 1, k'3 = -1 \tag{26}$$

whence $$F(\omega) = -\cos (2\omega Te) + 2 \cos (\omega Te) - 1. \tag{27}$$

$F(\omega)$ is of maximum value when its derivative $F'(\omega)$ with respect to $\omega$ is zero or else when $F'(\omega) = 2Te \times \sin (2\omega Te) - 2Te \times \sin (\omega Te) = 0$ or again $F'(\omega) = \sin (2\omega Te) - \sin (\omega Te) = 0$, and by developing sin $(2\omega Te)$, we obtain $2 \sin (\omega Te) \times \cos (\omega Te) = \sin (\omega Te)$ whence $\cos (\omega Te) = 0.5$ or again:

$$\omega Te = \frac{\pi}{3} \text{ and } \omega = \frac{\pi}{3Te} = 2\pi F.$$

Consequently, $F(\omega)$ is of maximum value in respect of $F = 1/6Te = 3$ MHz.

The maximum gain of $F(\omega)$ in respect of $F=3$ MHz is in that case:

$$F\max = -\cos \frac{2\pi}{3} + 2 \cos \frac{\pi}{3} - 1 = 0.5.$$

The coefficient $I(\alpha)$ verifies the following relations:

$$A\left(3 \text{ MHz}, \frac{\pi}{4}\right) = 1.0455 \quad A\left(3 \text{ MHz}, \frac{\pi}{4}\right) \times F(3 \text{ MHz}) =$$

$$1.0455 \times 0.5 =$$

either:

$$A'\left(3\text{ MHz}, \frac{\pi}{4}\right) = A\left(3\text{ MHz}, \frac{\pi}{4}\right) + A\left(3\text{ MHz}, \frac{\pi}{4}\right) \times$$

$$F(3\text{ MHz}) \times I\left(\frac{\pi}{4}\right)$$

or again:

$$A' = 1 = 1.0455 + (0.5 \times 1.0455) \times I\left(\frac{\pi}{4}\right).$$

Consequently, $$I\left(\frac{\pi}{4}\right) = \frac{1 - 1.0455}{0.5 \times 1.0455} = -0.087,$$

and the function $I(\alpha)$ then becomes:

$$I(\alpha) = -0.087 \times \sin 2\alpha. \tag{28}$$

Figure 23:
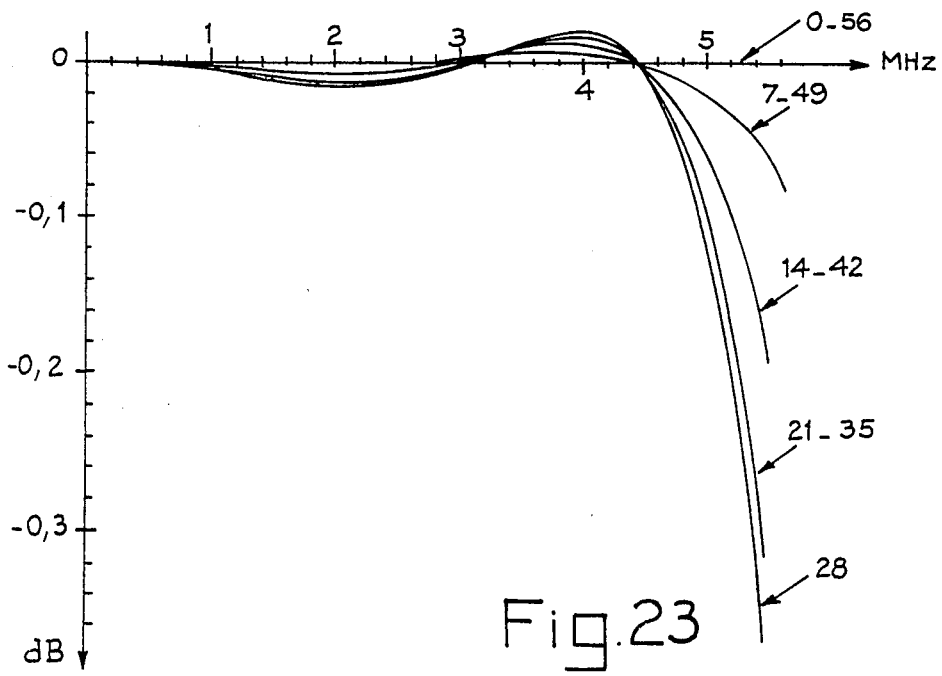
FIG. 23 is a plot showing the curve of the modulus of the transfer function of the filter obtained after an amplitude correction applied to the output of the phase corrector of FIG. 21.

This function can be obtained by storage of the values $I(\alpha)$ in a PROM memory which receives the value $\alpha$ as a phase reference. The modulus obtained after amplitude correction is shown in FIG. 23, and $\epsilon(\omega, \alpha)$ remains unchanged, namely as shown in FIG. 19.

The assembly of the phase-correcting filter of FIG. 14A with the gain corrector 31 of FIG. 21 so as to constitute the velocity corrector in accordance with the invention and with the schematic arrangement of FIG. 21 is illustrated in FIG. 24. As in FIG. 14A, the phase corrector of FIG. 24 consists of four multipliers 26 to 29 and of the summing circuit 25. As in FIGS. 21 and 22, the gain corrector 31 is constituted by the nonrecursive transversal filter 32 formed of the hereinabove described elements 35 to 44, of the summing circuit 33, and of the multiplier 34.

The output of the summing circuit 25 is connected to the input of the gain corrector 31 constituted by the input of the register 35 and one operand input of the multiplier 40. A programmable read-only memory or PROM 45 contains in memory the coefficients $k(i)(\alpha)$ and $I(\alpha)$ defined earlier by the relations (16), (17), (18) and (19). These coefficients are addressed by the phase shift $\alpha$. The coefficients $K(i)(\alpha)$ are applied to first operand inputs of the multipliers 26 to 29, and the coefficient $I(\alpha)$ is applied to a first operand input of the multiplier 34. The second operand inputs of the multipliers 26 to 29 are connected to the outputs of series-mounted shift registers 46 to 51 via a multiplexer 52 which serves to connect the second operand inputs of the multipliers 26 to 29 to the six outputs (b, c, d, e, f, g) of the registers 46 to 51 and to the input of the register 46 as a function of the phase shift $\alpha$ in accordance with the state diagram shown in FIG. 25. The time-delay produced by the gain corrector 31 is compensated by two registers 53 and 54 interposed in series between the output of the phase corrector and one operand input of the summing circuit 33, the other operand input being connected to the output of the multiplier 34.

The velocity corrector thus obtained is constructed with only five multipliers which perform multiplication by the coefficients $k(i)(\alpha)$ and $I(\alpha)$. Since the coefficients $k'(i)$ of the amplitude corrector bandpass filter have fixed values, these latter are established simply by wiring. The impulse response of the unit is represented by the table of FIG. 26, which simulates circulation of the unitary impulse having a time-duration Te within the velocity corrector. In this table, the values $k'1$, $k'2$ and $k'3$ are respectively $k'1 = -0.5$, $k'2 = 1$ and $k'3 = -1$ and are consequently independent of $\alpha$. The eight terms $K(i)(\alpha)$ thus obtained represent the samples of the impulse response at the instants $t + iTe$.

It is apparent from the foregoing that the velocity corrector in accordance with the invention could also be obtained by means of a single filter having eight coefficients $K(i)(\alpha)$. However, this design would entail the need for eight multipliers instead of five and a much larger PROM memory capacity, thus making this solution more costly.

It will also be noted that, in certain alternative forms of construction which consist, for example, in correcting any phase error within a sampling period, the constructional diagram of FIG. 24 may be simplified by suppressing the multiplexer 52 and by directly connecting the second operand inputs A, B, C, D of the multipliers 26 to 29, in the case of the inputs B, C, D respectively, to the outputs of three series-connected registers and, in the case of the input A, to the input of the first register which receives the samples of the video signal.

A further point worthy of note is that the invention is not limited to the use of a five-coefficient filter for the realization of the amplitude corrector and that it would accordingly be possible to employ a filter of any odd order. In this case, care should be taken to ensure that the path which is not corrected for amplitude is subjected to a time-delay equal to that of the bandpass filter.

What is claimed is:

1. A variable digital phase-shifter for correcting a signal having an instantaneous phase error $\alpha$, comprising:

a variable-propagation-time phase corrector constituted by a nonrecursive transversal digital filter having an input for receiving the signal to be corrected, an output, and four coefficient inputs for receiving four coefficients $k_1(\alpha)$, $k_2(\alpha)$, $k_3(\alpha)$ and $k_4(\alpha)$ depending on the value of the phase error $\alpha$, said coefficients related by the equations:

$$k_2(\alpha) - k_4(\alpha) = \cos(-\alpha)$$

$$k_1(\alpha) - k_3(\alpha) = \sin(-\alpha)$$

$$k_1(\alpha) + k_2(\alpha) + k_3(\alpha) + k_4(\alpha) = 1$$

$$-k_1(\alpha) + k_3(\alpha) + 2k_4(\alpha) = 2$$

and sampled at a frequency equal to four times the recurrence frequency of the signal to be phase-shifted; and an amplitude corrector coupled to the output of said nonrecursive transversal digital filter for correcting variations in gain of the phase corrector in order to obtain an approximately constant overall gain of the variable digital phase-shifter, and for delivering a gain corrected signal to an output thereof.

2. A variable digital phase-shifter according to claim 1, wherein the amplitude corrector comprises:

a bandpass filter having an input coupled to the output of the nonrecursive transversal digital filter of said phase corrector;

a multiplier circuit with a first input coupled to an output of said bandpass filter for multiplying a signal outputted by said bandpass filter by a constant signal $I(\alpha)$ received at a second input terminal thereof, depending on the phase error $\alpha$; and a summing circuit having a first input receiving the result of the multiplication and a second input coupled to the output of said nonrecursive transversal digital filter of said phase corrector, an output of said summing circuit forming the output of the amplitude corrector.

3. A phase-shifter according to claim 2, wherein the bandpass filter is a nonrecursive transversal digital filter with five coefficients having the respective values $-0.5, 1, -1, 1$ and $-0.5$.

4. A phase-shifter according to claim 2, wherein the values of the four coefficients $k_1(\alpha)$, $k_2(\alpha)$, $k_3(\alpha)$ and $k_4(\alpha)$ are stored within a programmable read-only memory addressed by the phase error value $\alpha$.

* * * * *